(12) United States Patent
Dino et al.

(10) Patent No.: US 7,046,042 B1
(45) Date of Patent: May 16, 2006

(54) PHASE DETECTOR

(75) Inventors: Shmuel Dino, Asadod (IL); David Moshe, D.N. Gilboa (IL)

(73) Assignee: Marvell Semiconductor Israel Ltd., Hamilton (BM)

( * ) Notice: Subject to any disclaimer, the term of this patent is extended or adjusted under 35 U.S.C. 154(b) by 0 days.

(21) Appl. No.: 10/868,897

(22) Filed: Jun. 17, 2004

Related U.S. Application Data

(60) Provisional application No. 60/494,229, filed on Aug. 11, 2003.

(51) Int. Cl.
*H03D 13/00* (2006.01)

(52) U.S. Cl. .............................. 327/3; 327/12; 331/25
(58) Field of Classification Search .............. 327/2–4, 327/7–10, 12, 39–47, 49, 162, 163; 331/25
See application file for complete search history.

(56) References Cited

U.S. PATENT DOCUMENTS

| | | | | |
|---|---|---|---|---|
| 4,819,081 A * | 4/1989 | Volk et al. | ...................... | 327/12 |
| 4,904,948 A * | 2/1990 | Asami | .......................... | 327/12 |
| 5,095,233 A | 3/1992 | Ashby et al. | ................ | 327/149 |
| 5,910,741 A * | 6/1999 | Watanabe | .................... | 327/150 |
| 6,222,407 B1 | 4/2001 | Gregor | ........................ | 327/269 |
| 6,323,692 B1 * | 11/2001 | Tsinker | ......................... | 327/12 |
| 6,366,150 B1 | 4/2002 | Ishimi | ......................... | 327/276 |
| 6,388,482 B1 | 5/2002 | Schnell et al. | ............... | 327/158 |
| 6,411,130 B1 * | 6/2002 | Gater | .......................... | 327/12 |
| 6,483,389 B1 * | 11/2002 | Lamb | .......................... | 331/25 |
| 6,504,408 B1 | 1/2003 | Von Kaenel | ................ | 327/158 |
| 6,538,517 B1 | 3/2003 | Lu | ................................ | 331/17 |
| 6,539,072 B1 | 3/2003 | Donnelly et al. | ............ | 375/371 |
| 6,587,534 B1 | 7/2003 | Hassoun et al. | ............ | 375/376 |
| 6,603,300 B1 | 8/2003 | Lin et al. | ................... | 324/76.54 |
| 6,611,475 B1 | 8/2003 | Lin | .............................. | 365/233 |
| 6,636,079 B1 * | 10/2003 | Koyama | ......................... | 327/7 |
| 6,683,478 B1 * | 1/2004 | Yoo | ............................. | 327/12 |
| 6,774,689 B1 * | 8/2004 | Sudjian | ....................... | 327/158 |
| 6,779,126 B1 * | 8/2004 | Lin et al. | ..................... | 713/500 |
| 6,856,202 B1 * | 2/2005 | Lesso | ........................ | 331/1 A |
| 2001/0015666 A1 | 8/2001 | Noda et al. | .................. | 327/269 |
| 2003/0122599 A1 | 7/2003 | Kim | ............................ | 327/161 |
| 2004/0201426 A1 * | 10/2004 | Chou et al. | .................. | 331/1 A |

* cited by examiner

Primary Examiner—Timothy P. Callahan
Assistant Examiner—Hai L. Nguyen

(57) ABSTRACT

A phase detector includes a first flip-flop responsive to a reference clock signal, a first inverter responsive to an output of the first flip-flop, a second flip-flop responsive to a feedback clock signal, a second inverter responsive to an output of the second flip-flop, a third inverter responsive to an output of the first inverter, a fourth inverter responsive to an output of the second inverter, a first conjunction circuit responsive to the output of the first inverter and to an output of the fourth inverter, and a second conjunction circuit responsive to the output of the second inverter and to an output of the third inverter. The first conjunction circuit outputs a first alignment signal when the feedback clock signal is earlier than the reference clock signal, and the second conjunction circuit outputs a second alignment signal when the feedback clock signal is later than the reference clock signal.

45 Claims, 4 Drawing Sheets

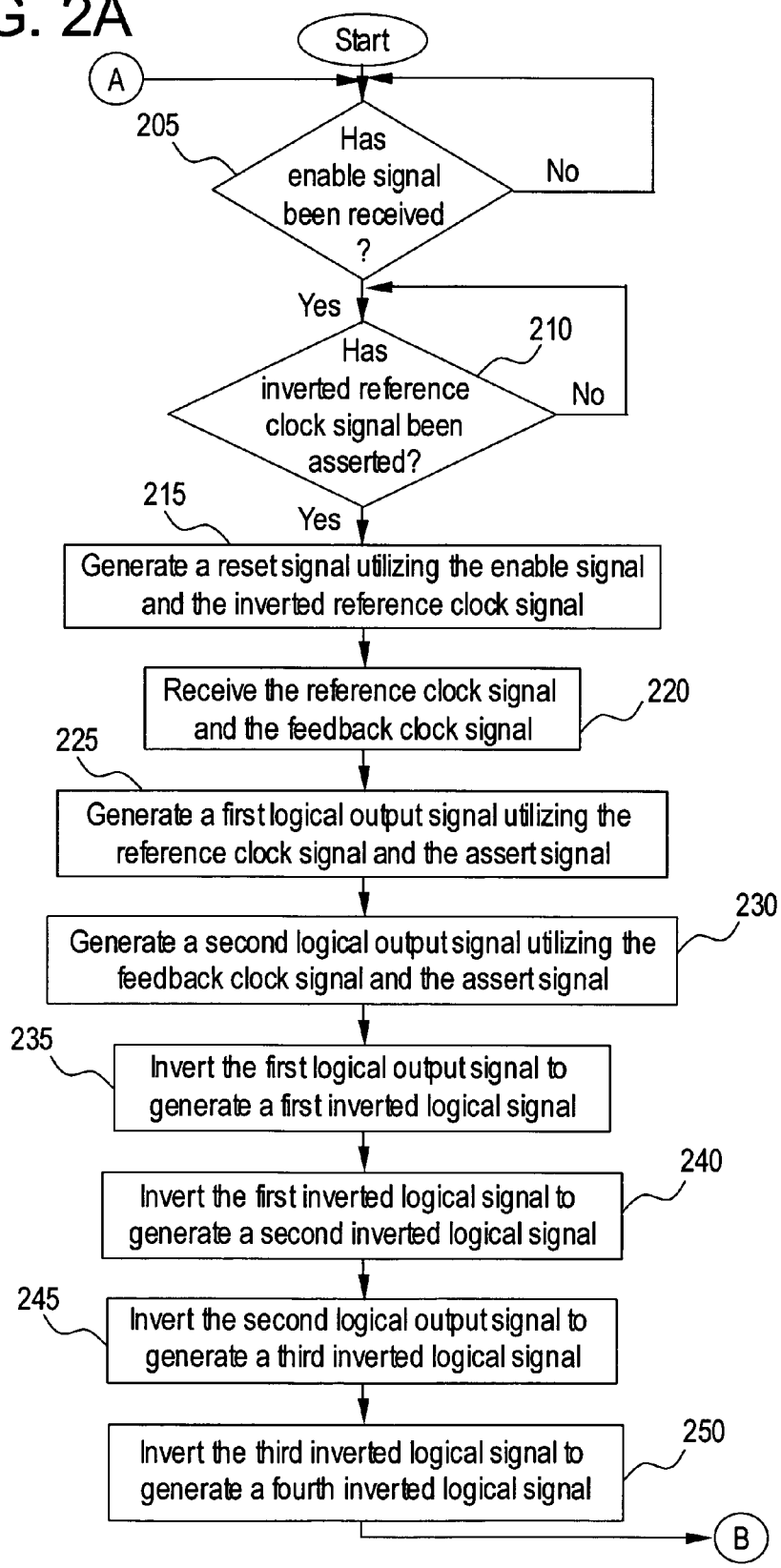

PHASE DETECTOR

This application claims priority under 35 U.S.C. § 119(e) to U.S. Provisional Application No. 60/494,229, filed on Aug. 11, 2003, the entire content of which is hereby incorporated herein by reference.

BACKGROUND

1. Field of the Invention

The present invention relates to integrated circuits. More particularly, the present invention relates to a phase detector for aligning a reference clock signal and a feedback clock signal.

2. Background Information

Synchronous digital systems, including board-level systems and chip-level systems, rely on one or more clock signals to synchronize elements across the system. Typically, one or more clock signals are distributed across the system on one or more clock lines. However, due to various problems such as clock buffer delays, high capacitance of heavily loaded clock lines, and propagation delays, the rising edges of a clock signal in different parts of the system may not be synchronized. The time difference between a rising (or falling) edge in one part of the system with the corresponding rising (or falling) edge in another part of the system is referred to as "clock skew".

Clock skew can cause digital systems to malfunction. For example, it is common for circuits in digital systems to have a first flip-flop output driving a second flip-flop input. With a synchronized clock on the clock input of both flip-flops, the data in the first flip-flop is successfully clocked into the second flip-flop. However, if the active edge on the second flip flop is delayed by clock skew, the second flip-flop might not capture the data from the first flip-flop before the first flip-flop changes state.

In particular, it can be difficult to synchronize a reference clock signal and feedback clock signal in such chip-level systems. For example, to synchronize or otherwise align such clock signals, a delay line can be incremented tap-by-tap until the reference clock signal is aligned with the feedback clock signal. Once the appropriate delay is determined for synchronizing or otherwise aligning the clock signals, the delay can be locked. However, such clock signal alignment mechanisms are complex.

SUMMARY OF THE INVENTION

A system and method are disclosed for aligning a reference clock signal and a feedback clock signal. In accordance with exemplary embodiments, according to a first aspect of the present invention, a phase detector includes a first bistable circuit. The first bistable circuit is configured to receive a reference clock signal. An output of the first bistable circuit is in communication with a first inverter circuit. The phase detector includes a second bistable circuit. The second bistable circuit is configured to receive a feedback clock signal. An output of the second bistable circuit is in communication with a second inverter circuit. An output of the first inverter circuit is in communication with a first conjunction circuit and a third inverter circuit. An output of the second inverter circuit is in communication with a second conjunction circuit and a fourth inverter circuit. An output of the third inverter circuit is in communication with the second conjunction circuit. An output of the fourth inverter circuit is in communication with the first conjunction circuit. The first conjunction circuit is configured to output a first alignment signal when the feedback clock signal is earlier than the reference clock signal and the second conjunction circuit is configured to output a second alignment signal when the feedback clock signal is later than the reference clock signal.

According to the first aspect, the phase detector includes a third bistable circuit. The third bistable circuit is configured to receive an enable signal for enabling the phase detector and to receive an inverted reference clock signal. The third bistable circuit is in communication with each of the first and second bistable circuits. The third bistable circuit is configured to output a reset signal to each of the first and second bistable circuits. According to an exemplary embodiment of the first aspect, the first, second and third bistable circuits can each comprise a flip-flop circuit, such as, for example, D flip-flop circuits. The first and second bistable circuits are each configured to receive an assert signal. The first and second conjunction circuits can each comprise an AND gate circuit. The feedback clock signal and the reference clock signal can each be sampled on a negative edge of the reference clock signal. The phase detector can be formed on a monolithic substrate. The phase detector can also include alignment circuitry for aligning the reference clock signal and the feedback clock signal utilizing the first alignment signal or the second alignment signal. The alignment circuitry is in communication with the phase detector.

According to a second aspect of the present invention, an integrated circuit includes a first flip-flop responsive to a reference clock signal and a first inverter responsive to an output of the first flip-flop. The integrated circuit includes a second flip-flop responsive to a feedback clock signal and a second inverter responsive to an output of the second flip-flop. The integrated circuit includes a third inverter responsive to an output of the first inverter and a fourth inverter responsive to an output of the second inverter. The integrated circuit includes a first AND gate responsive to the output of the first inverter and to an output of the fourth inverter. The integrated circuit also includes a second AND gate responsive to the output of the second inverter and to an output of the third inverter.

According to the second aspect, the first AND gate is configured to output a first alignment signal when the feedback clock signal is earlier than the reference clock signal. The second AND gate is configured to output a second alignment signal when the feedback clock signal is later than the reference clock signal. The integrated circuit can include alignment circuitry for aligning the reference clock signal and the feedback clock signal utilizing the first alignment signal or the second alignment signal. The integrated circuit includes a third flip-flop responsive to an enable signal and an inverted reference clock signal. An output of the third flip-flop is configured to reset each of the first and second flip-flops. According to an exemplary embodiment of the second aspect, the first, second and third flip-flops can each comprise a D flip-flop. The first and second flip-flops are each configured to receive an assert signal. The feedback clock signal and the reference clock signal can each be sampled on a negative edge of the reference clock signal.

According to a third aspect of the present invention, a phase detector for aligning a reference clock signal and a feedback clock signal is formed on a monolithic substrate. The phase detector includes a first flip-flop responsive to the reference clock signal and an assert signal and a first inverter responsive to an output of the first flip-flop. The phase detector includes a second flip-flop responsive to the feedback clock signal and the assert signal and a second inverter responsive to an output of the second flip-flop. The phase detector includes a third inverter responsive to an output of the first inverter and a fourth inverter responsive to an output of the second inverter. The phase detector includes a first AND gate responsive to the output of the first inverter and an output of the fourth inverter. The phase detector includes a second AND gate responsive to the output of the second inverter and an output of the third inverter. The phase detector also includes a third flip-flop responsive to an enable signal for enabling the phase detector and to an inverted reference clock signal. An output of the third flip-flop is configured to reset each of the first and second flip-flops. The first AND gate is configured to output a first alignment signal when the feedback clock signal is earlier than the reference clock signal, and the second AND gate is configured to output a second alignment signal when the feedback clock signal is later than the reference clock signal.

According to the third aspect, the first, second and third flip-flops can each comprise a D flip-flop. The feedback clock signal and the reference clock signal can each be sampled on a negative edge of the reference clock signal. The phase detector can include alignment circuitry for aligning the reference clock signal and the feedback clock signal utilizing the first alignment signal or the second alignment signal.

According to a fourth aspect of the present invention, a phase detector includes a first bistable means for receiving a reference clock signal and for outputting a first logical signal to a first inverter means. The phase detector includes a second bistable means for receiving a feedback clock signal and for outputting a second logical signal to a second inverter means. An output of the first inverter means is in communication with a first conjunction means and a third inverter means. An output of the second inverter means is in communication with a second conjunction means and a fourth inverter means. An output of the third inverter means is in communication with the second conjunction means. An output of the fourth inverter means is in communication with the first conjunction means. The first conjunction means is configured to output a first alignment signal when the feedback clock signal is earlier than the reference clock signal, and the second conjunction means is configured to output a second alignment signal when the feedback clock signal is later than the reference clock signal.

According to the fourth aspect, the phase detector includes a third bistable means for receiving an enable signal for enabling the phase detector, for receiving an inverted reference clock signal, and for outputting a reset signal to each of the first and second bistable means. According to an exemplary embodiment of the fourth aspect, the first, second and third bistable means can each comprise a flip-flop means, such as, for example, a D flip-flop means. The first and second bistable means are each configured to receive an assert signal. The first and second conjunction means can each comprise an AND gate means. The feedback clock signal and the reference clock signal are each sampled on a negative edge of the reference clock signal. The phase detector can be formed on a monolithic substrate. The phase detector can include means for aligning the reference clock signal and the feedback clock signal utilizing the first alignment signal or the second alignment signal. The aligning means can be in communication with the phase detector.

According to a fifth aspect of the present invention, an integrated circuit includes a first flip-flop means for receiving a reference clock signal and a first inverter means for receiving an output of the first flip-flop. The integrated circuit includes a second flip-flop means for receiving a feedback clock signal and a second inverter means for receiving an output of the second flip-flop means. The integrated circuit includes a third inverter means for receiving an output of the first inverter means and a fourth inverter means for receiving an output of the second inverter means. The integrated circuit includes a first AND gate means for conjunctively receiving the output of the first inverter means and an output of the fourth inverter means, and a second AND gate means for conjunctively receiving the output of the second inverter means and an output of the third inverter means.

According to the fifth aspect, the first AND gate means is configured to output a first alignment signal when the feedback clock signal is earlier than the reference clock signal and the second AND gate means is configured to output a second alignment signal when the feedback clock signal is later than the reference clock signal. The integrated circuit can include means for aligning the reference clock signal and the feedback clock signal utilizing the first alignment signal or the second alignment signal. The integrated circuit includes a third flip-flop means for receiving an enable signal, for receiving an inverted reference clock signal, and for outputting a reset signal to each of the first and second flip-flop means. According to an exemplary embodiment of the fifth aspect, the first, second and third flip-flop means can each comprise a D flip-flop means. The first and second flip-flop means are each configured to receive an assert signal. The feedback clock signal and the reference clock signal can each be sampled on a negative edge of the reference clock signal.

According to a sixth aspect of the present invention, a phase detector for aligning a reference clock signal and a feedback clock signal is formed on a monolithic substrate. The phase detector includes a first flip-flop means for receiving the reference clock signal and an assert signal, and a first inverter means for receiving an output of the first flip-flop means. The phase detector includes a second flip-flop means for receiving the feedback clock signal and the assert signal, and a second inverter means for receiving an output of the second flip-flop means. The phase detector includes a third inverter means for receiving an output of the first inverter means, and a fourth inverter means for receiving an output of the second inverter means. The phase detector includes a first AND gate means for conjunctively receiving the output of the first inverter means and an output of the fourth inverter means, and a second AND gate means for conjunctively receiving the output of the second inverter means and an output of the third inverter means. The phase detector includes a third flip-flop means for receiving an enable signal for enabling the phase detector, for receiving an inverted reference clock signal, and for outputting a reset signal to each of the first and second flip-flop means. The first AND gate means is configured to output a first alignment signal when the feedback clock signal is earlier than the reference clock signal and the second AND gate is configured to output a second alignment signal when the feedback clock signal is later than the reference clock signal.

According to the sixth aspect, the first, second and third flip-flop means can each comprise a D flip-flop means. The feedback clock signal and the reference clock signal can each be sampled on a negative edge of the reference clock signal. The phase detector can include means for aligning the reference clock signal and the feedback clock signal utilizing the first alignment signal or the second alignment signal.

According to a seventh aspect of the present invention, a method of aligning a reference clock signal and a feedback clock signal includes the steps of: a.) receiving the reference clock signal and the feedback clock signal; b.) generating a first logical output signal utilizing the reference clock signal and an assert signal; c.) generating a second logical output signal utilizing the feedback clock signal and the assert signal; d.) inverting the first logical output signal to generate a first inverted logical signal; e.) inverting the first inverted logical signal to generate a second inverted logical signal; f.) inverting the second logical output signal to generate a third inverted logical signal; g.) inverting the third inverted logical signal to generate a fourth inverted logical signal; h.) conjunctively combining the first inverted logical signal and the fourth inverted logical signal to output a first alignment signal, wherein the first alignment signal is output when the feedback clock signal is earlier than the reference clock signal; and i.) conjunctively combining the second inverted logical signal and the third inverted logical signal to output a second alignment signal, wherein the second alignment signal is output when the feedback clock signal is later than the reference clock signal.

According to the seventh aspect, the method includes the steps of: j.) receiving an enable signal and an inverted reference clock signal; k.) generating a reset signal; and l.) resetting steps (b) and (c) utilizing the reset signal. The step (a) can comprise the step of: m.) sampling the feedback clock signal and the reference clock signal on a negative edge of the reference clock signal. The method can includes the step of: j.) aligning the reference clock signal and the feedback clock signal utilizing the first alignment signal or the second alignment signal.

According to an eighth aspect of the present invention, a method of aligning a reference clock signal and a feedback clock signal includes the steps of:
  a.) receiving an enable signal and an inverted reference clock signal; b.) generating a reset signal utilizing the enable signal and the inverted clock signal; c.) receiving the reference clock signal and the feedback clock signal; d.) sampling the feedback clock signal and the reference clock signal on a negative edge of the reference clock signal utilizing the reset signal; e.) generating a first logical output signal utilizing the reference clock signal and an assert signal; f.) generating a second logical output signal utilizing the feedback clock signal and the assert signal; g.) inverting the first logical output signal to generate a first inverted logical signal; h.) inverting the first inverted logical signal to generate a second inverted logical signal; i.) inverting the second logical output signal to generate a third inverted logical signal; j.) inverting the third inverted logical signal to generate a fourth inverted logical signal; k.) conjunctively combining the first inverted logical signal and the fourth inverted logical signal to output a first alignment signal, wherein the first alignment signal is output when the feedback clock signal is earlier than the reference clock signal; l.) conjunctively combining the second inverted logical signal and the third inverted logical signal to output a second alignment signal, wherein the second alignment signal is output when the feedback clock signal is later than the reference clock signal; and m.) aligning the reference clock signal and the feedback clock signal utilizing the first alignment signal or the second alignment signal.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein:

FIGS. 2A and 2B are flowcharts illustrating steps for aligning a reference clock signal and a feedback clock signal, in accordance with an exemplary embodiment of the present invention.

DETAILED DESCRIPTION OF THE PREFERRED EMBODIMENTS

Exemplary embodiments of the present invention are directed to a phase detection system and method for use in aligning a reference clock signal and a feedback clock signal. According to exemplary embodiments, a phase detector formed on a monolithic substrate includes a first flip-flop responsive to the reference clock signal and an assert signal. A first inverter is coupled to an output of the first flip-flop. The phase detector includes a second flip-flop responsive to the feedback clock signal and the assert signal. A second inverter is coupled to an output of the second flip-flop. A third inverter is coupled to an output of the first inverter and a fourth inverter is coupled to an output of the second inverter. The phase detector includes a first AND gate coupled to the output of the first inverter and an output of the fourth inverter. The phase detector also includes a second AND gate coupled to the output of the second inverter and an output of the third inverter. When the phase detector is enabled, the first AND gate is configured to output a first alignment signal when the feedback clock signal is earlier than the reference clock signal, and the second AND gate is configured to output a second alignment signal when the feedback clock signal is later than the reference clock signal. The alignment signals output by the first and second AND gates can be used, for example, to increment or decrement a delay lock loop or delay line to increase or decrease, respectively, the timing or propagation delay of one clock signal relative to the other to align the feedback clock signal with the reference clock signal. The phase detector according to exemplary embodiments comprises an all-digital structure of lesser complexity compared to analog devices.

Figure 1:
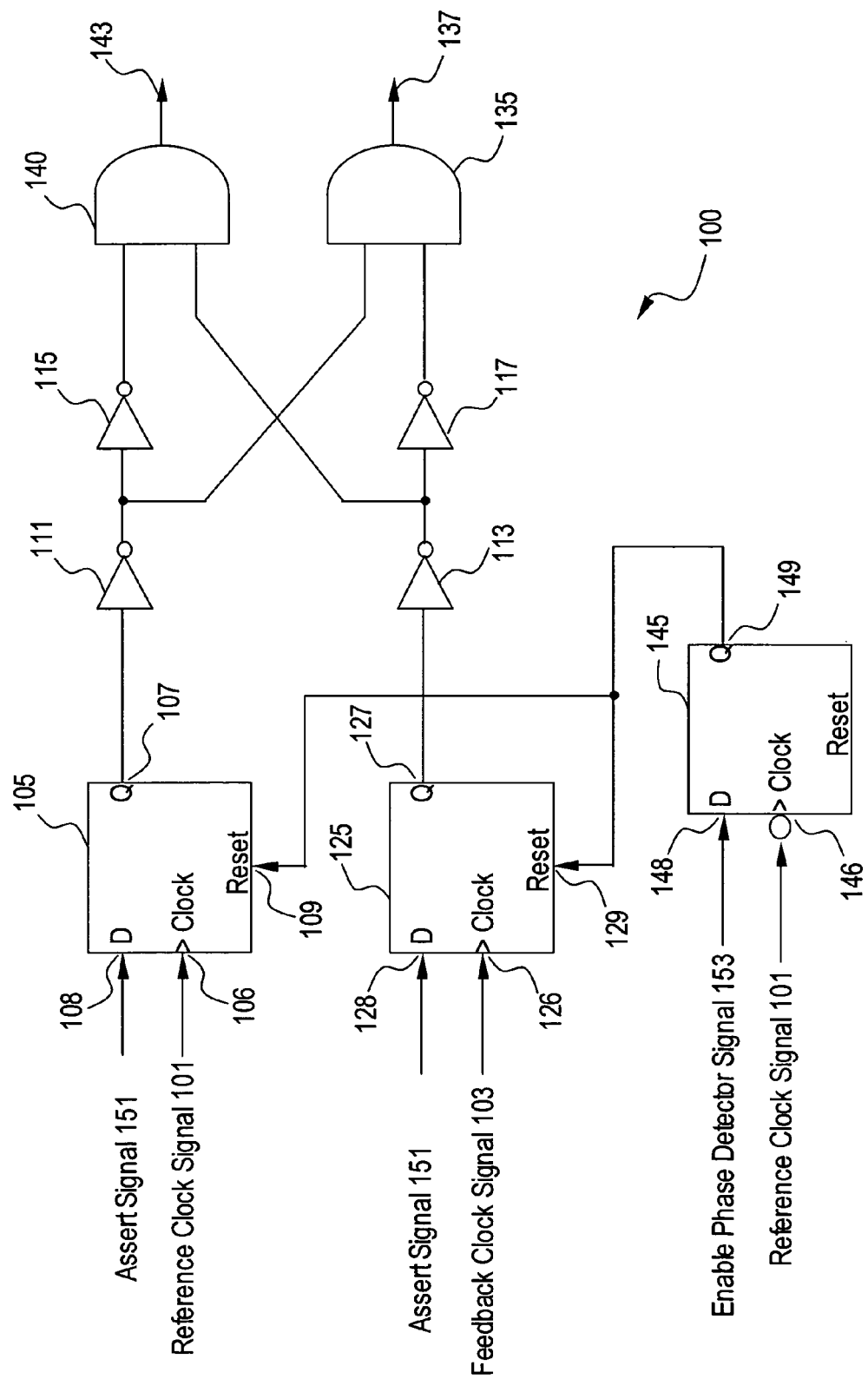
FIG. 1 is a circuit diagram illustrating a phase detector for aligning a reference clock signal and a feedback clock signal, in accordance with an exemplary embodiment of the present invention.

These and other aspects of the present invention will now be described in greater detail. FIG. 1 is a circuit diagram illustrating a phase detector 100 for aligning a reference clock signal 101 and a feedback clock signal 103, in accordance with an exemplary embodiment of the present invention. The phase detector 100 includes a first bistable circuit 105. The first bistable circuit 105 is configured to receive the reference clock signal 101 on clock input 106 of the first bistable circuit 105. The first bistable circuit 105 is also configured to receive an assert signal 151 on input 108 of the first bistable circuit 105. An output 107 of the first bistable circuit 105 is in communication with a first inverter circuit 111.

The phase detector 100 includes a second bistable circuit 125. The second bistable circuit 125 is configured to receive the feedback clock signal 103 on clock input 126 of the second bistable circuit 125. The second bistable circuit 125 is also configured to receive the assert signal 151 on input 128 of the second bistable circuit 125. An output 127 of the second bistable circuit 125 is in communication with a second inverter circuit 113. An output of the first inverter circuit 111 is in communication with a first conjunction circuit 135 and a third inverter circuit 115. An output of the second inverter circuit 113 is in communication with a second conjunction circuit 140 and a fourth inverter circuit 117. Additionally, an output of the third inverter circuit 115 is in communication with the second conjunction circuit 140, and an output of the fourth inverter circuit 117 is in communication with the first conjunction circuit 135.

The phase detector 100 includes a third bistable circuit 145. The third bistable circuit 145 is configured to receive the reference clock signal 101 on the inverted clock input 146. The third bistable circuit 145 is also configured to receive an enable phase detector signal 153 on input 148 of the third bistable circuit 145. An output 149 of the third bistable circuit 145 is in communication with reset input 109 of the first bistable circuit 105 and with reset input 129 of the second bistable circuit 125. The output 149 of the third bistable circuit 145 is configured to output a reset signal to reset each of the first and second bistable circuits 105 and 125 on the negative (falling) edge of the reference clock signal 101.

According to exemplary embodiments, the first, second and third bistable circuits 105, 125 and 145 can each comprise any suitable type of flip-flop circuit, such as, for example, a D flip-flop circuit. For example, the first and second bistable circuits 105 and 125 can each comprise a positive-edge-triggered D flip-flop or the like, while the third bistable circuit 145 can comprise a negative-edge-triggered D flip-flop or the like. The first and second conjunction circuits 135 and 140 can each comprise an AND gate circuit or the like.

According to exemplary embodiments, the first conjunction circuit 135 is configured to output a first alignment signal 137 when the feedback clock signal 103 is earlier than the reference clock signal 101 (i.e., the feedback clock signal 103 "leads" the reference clock signal 101, or the reference clock signal 101 "lags" the feedback clock signal 103). The second conjunction circuit 140 is configured to output a second alignment signal 143 when the feedback clock signal 103 is later than the reference clock signal 101 (i.e., the feedback clock signal 103 "lags" the reference clock signal 101, or the reference clock signal 101 "leads" the feedback clock signal 103). More particularly, when the enable phase detector signal 153 received on input 148 of the third bistable circuit 145 is an assert, the output 149 of the negative-edge-triggered D flip-flop (of the third bistable circuit 145) becomes an assert on the negative (falling) edge of the reference clock signal 101 received on inverted clock input 148 of the third bistable circuit 145. The assert signal from output 149 of the third bistable circuit 145 resets both first and second bistable circuits 105 and 125. Thus, the reference clock signal 101 input to the first bistable circuit 105 and the feedback clock signal 103 input to the second bistable circuit 125 are each sampled on the negative (falling) edge of the reference clock signal 101.

With the assert signal 151 applied to both the first and second bistable circuits 105 and 125, if feedback clock signal 103 is an assert and reference clock signal 101 is a de-assert, the output 107 of the positive-edge-triggered D flip-flop of the first bistable circuit 105 becomes a de-assert. In addition, the output 127 of the positive-edge-triggered D flip-flop of the second bistable circuit 125 becomes an assert. Consequently, the output of the first inverter 111 becomes an assert, which is applied to an input of the first conjunction circuit 135. An output of the second inverter 113 becomes a de-assert, which is applied to an input of the second conjunction circuit 140. Additionally, the assert output by the first inverter circuit 111 is inverted to a de-assert by the third inverter 115, which is applied to another input of the second conjunction circuit 140. The de-assert output by the second inverter circuit 113 is inverted to an assert by the fourth inverter circuit 117, which is applied to another input of the first conjunction circuit 135. Thus, with each input to the second conjunction circuit 140 being a de-assert, the output of the second conjunction circuit 140 is also a de-assert. However, since each input to the first conjunction circuit 135 is an assert, the output of the first conjunction circuit 135 is also an assert. Therefore, if the feedback clock signal 103 is earlier than the reference clock signal 101, the first conjunction circuit 135 outputs the first alignment signal 137 (e.g., an assert signal).

Alternatively, with assert signal 151 applied to both the first and second bistable circuits 105 and 125, if reference clock signal 101 is an assert and feedback clock signal 103 is a de-assert, the output 107 of the positive-edge-triggered D flip-flop of the first bistable circuit 105 becomes an assert. In addition, the output 127 of the positive-edge-triggered D flip-flop of the second bistable circuit 125 becomes a de-assert. Consequently, the output of the first inverter 111 becomes a de-assert, which is applied to an input of the first conjunction circuit 135. An output of the second inverter 113 becomes an assert, which is applied to an input of the second conjunction circuit 140. Additionally, the de-assert output by the first inverter circuit 111 is inverted to an assert by the third inverter 115, which is applied to another input of the second conjunction circuit 140. The assert output by the second inverter circuit 113 is inverted to a de-assert by the fourth inverter circuit 117, which is applied to another input of the first conjunction circuit 135. Thus, with each input to the first conjunction circuit 135 being a de-assert, the output of the first conjunction circuit 135 is also a de-assert. However, since each input to the second conjunction circuit 140 is an assert, the output of the second conjunction circuit 140 is also an assert. Therefore, if the reference clock signal 101 is earlier than the feedback clock signal 103, the second conjunction circuit 140 outputs the second alignment signal 143 (e.g., an assert signal).

According to either exemplary embodiment, the output of the phase detector 100 can be used by any suitable means for synchronizing or otherwise aligning in time the reference clock signal 101 and feedback clock signal 103, based on either the first or second alignment signals 137 and 140. For example, the first or second alignment signals 137 and 143 output by the phase detector 100 can be used to control a delay lock loop, a delay line or the like for controlling (e.g., increasing or decreasing) the propagation delay of one clock signal relative to the other to align the clock signals. Once the appropriate delay for aligning the clock signals has been detected, the delay can then be locked or periodically or continuously adapted, depending on the requirements of the system. According to exemplary embodiments, however, if both the reference clock signal 101 and the feedback clock signal 103 are de-assert signals at the time that the first and second bistable circuits 105 and 125 are reset by the third bistable circuit 145, no alignment signal is output by either the first or second conjunction circuits 135 and 140. In such a situation, the reference clock signal 101 and the feedback clock signal 103 are aligned in time and synchronized.

The components of the phase detector 100, or any combination thereof, can be formed on, for example, a monolithic substrate. Alternatively, each element, or any combination thereof, can be any suitable type of electrical or electronic component or device that is capable of performing the functions associated with the respective element. According to such an alternative exemplary embodiment, each component or device can be in communication with another component or device using any appropriate type of electrical connection that is capable of carrying electrical information. Additionally, the assert and de-assert signals can be any suitable logical high (e.g., a "1") and logical low (e.g., a "0") signals, respectively.

Exemplary embodiments of the present invention can be used as at least part of an integrated circuit or any other suitable type of circuit that requires alignment between a reference clock signal and a feedback clock signal.

Figure 2B:
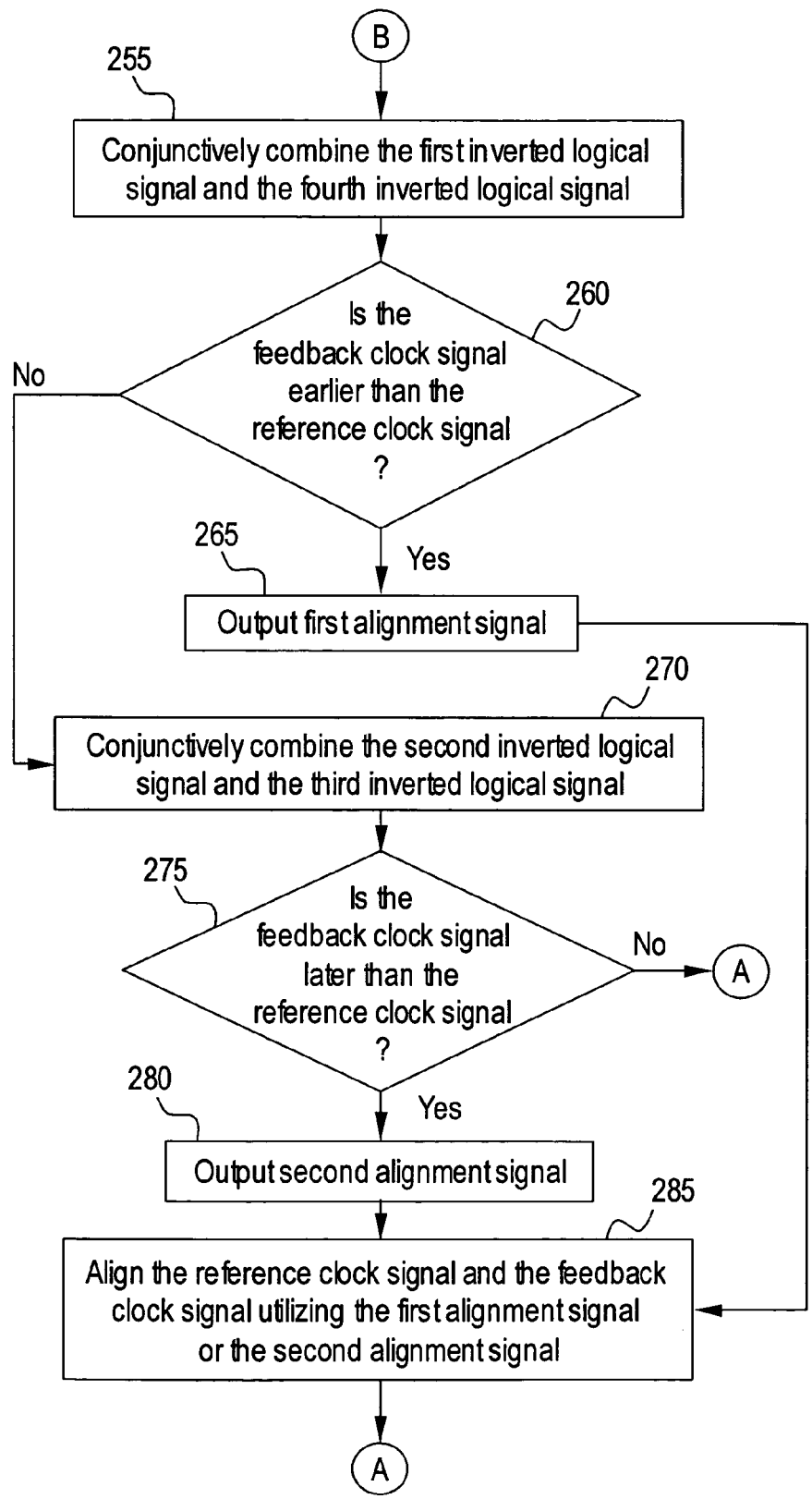

FIGS. 2A and 2B are flowcharts illustrating steps for aligning a reference clock signal and a feedback clock signal, in accordance with an exemplary embodiment of the present invention. In step 205 of FIG. 2A, a determination is made as to whether an enable signal has been received. If not, the process returns to step 205 to await the enable signal. If an enable signal has been received, then in step 210, a determination is made as to whether an inverted reference clock signal has been asserted. If not, the process returns to step 210 to await the inverted reference clock signal being asserted. If the inverted reference clock signal has been asserted, then in step 215, a reset signal is generated utilizing the enable signal and the inverted reference clock signal. In step 220, the reference clock signal and the feedback clock signal are received. In step 225, a first logical output signal is generated utilizing the reference clock signal and an assert signal. In step 230, a second logical output signal is generated utilizing the feedback clock signal and the assert signal. In step 235, the first logical output signal is inverted to generate a first inverted logical signal. In step 240, the first inverted logical signal is inverted to generate a second inverted logical signal. In step 245, the second logical output signal is inverted to generate a third inverted logical signal. In step 250, the third inverted logical signal is inverted to generate a fourth inverted logical signal.

In step 255 of FIG. 2B, the first inverted logical signal and the fourth inverted logical signal are conjunctively combined. In step 260, a determination is made as to whether the feedback clock signal is earlier than the reference clock signal. According to exemplary embodiments, if both the first inverted logical signal and the fourth inverted logical signal are assert signals, then the feedback clock signal is earlier than the reference clock signal. If so, then in step 265, a first alignment signal is output and the process moves to step 285. If not, then in step 270, the second inverted logical signal and the third inverted logical signal are conjunctively combined. In step 275, a determination is made as to whether the feedback clock signal is later than the reference clock signal. According to exemplary embodiments, this occurs when both the second inverted logical signal and the third inverted logical signal are assert signals. If not, then the process returns to step 205. If so, then in step 280, a second alignment signal is output. In step 285, the reference clock signal and the feedback clock signal are aligned utilizing the first alignment signal or the second alignment signal. The process then returns to step 205.

According to an alternative exemplary embodiment, both of steps 255 and 270 of FIG. 2B can be executed during the process, regardless of which clock signal is earlier than the other. However, even though both of steps 255 and 270 can be executed, either the first or second alignment signal would be output, depending on which of the reference clock signal and the feedback clock signal is earlier than the other.

Figure 3:
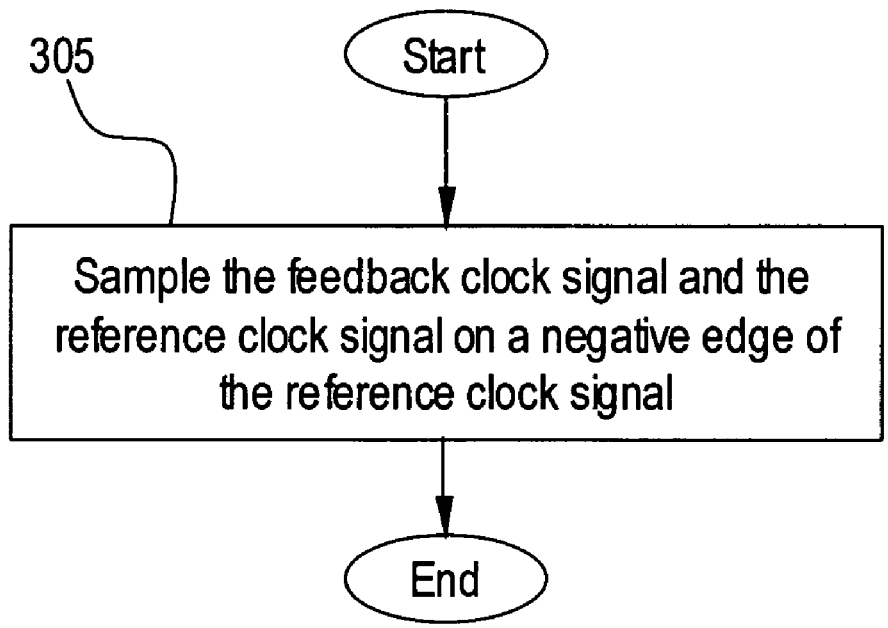
FIG. 3 is a flowchart illustrating steps for receiving a reference clock signal and a feedback clock signal, in accordance with an exemplary embodiment of the present invention.

FIG. 3 is a flowchart illustrating steps for step 220 of FIG. 2A of receiving a reference clock signal and a feedback clock signal, in accordance with an exemplary embodiment of the present invention. In step 305, the feedback clock signal and the reference clock signal are both sampled on a negative (falling) edge of the reference clock signal.

It will be appreciated by those of ordinary skill in the art that the present invention can be embodied in various specific forms without departing from the spirit or essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

All United States patents and applications, foreign patents, and publications discussed above are hereby incorporated herein by reference in their entireties.

What is claimed is:

1. A phase detector, comprising:
   a first bistable circuit,
      wherein the first bistable circuit is configured to receive a reference clock signal, and
      wherein an output of the first bistable circuit is in communication with a first inverter circuit; and
   a second bistable circuit,
      wherein the second bistable circuit is configured to receive a feedback clock signal,
      wherein an output of the second bistable circuit is in communication with a second inverter circuit,
      wherein an output of the first inverter circuit is in communication with a first conjunction circuit and a third inverter circuit,
      wherein an output of the second inverter circuit is in communication with a second conjunction circuit and a fourth inverter circuit,
      wherein an output of the third inverter circuit is in communication with the second conjunction circuit,
      wherein an output of the fourth inverter circuit is in communication with the first conjunction circuit, and
      wherein the first conjunction circuit is configured to output a first alignment signal when the feedback clock signal is earlier than the reference clock signal and the second conjunction circuit is configured to output a second alignment signal when the feedback clock signal is later than the reference clock signal.

2. The phase detector of claim 1, comprising:
   a third bistable circuit,
      wherein the third bistable circuit is configured to receive an enable signal for enabling the phase detector and to receive an inverted reference clock signal,
      wherein the third bistable circuit is in communication with each of the first and second bistable circuits, and
      wherein the third bistable circuit is configured to output a reset signal to each of the first and second bistable circuits.

3. The phase detector of claim 2, wherein the first, second and third bistable circuits each comprise a flip-flop circuit.

4. The phase detector of claim 2, wherein the first, second and third flip-flop circuits each comprise a D flip-flop circuit.

5. The phase detector of claim 1, wherein the first and second bistable circuits are each configured to receive an assert signal.

6. The phase detector of claim 1, wherein the first and second conjunction circuits each comprise an AND gate circuit.

7. The phase detector of claim 1, wherein the feedback clock signal and the reference clock signal are each sampled on a negative edge of the reference clock signal.

8. The phase detector of claim 1, wherein the phase detector is formed on a monolithic substrate.

9. The phase detector of claim 1, comprising:
alignment circuitry for aligning the reference clock signal and the feedback clock signal utilizing one of the first alignment signal and the second alignment signal,
wherein the alignment circuitry is in communication with the phase detector.

10. An integrated circuit, comprising:
a first flip-flop responsive to a reference clock signal;
a first inverter responsive to an output of the first flip-flop;
a second flip-flop responsive to a feedback clock signal;
a second inverter responsive to an output of the second flip-flop;
a third inverter responsive to an output of the first inverter;
a fourth inverter responsive to an output of the second inverter;
a first AND gate responsive to the output of the first inverter and to an output of the fourth inverter; and
a second AND gate responsive to the output of the second inverter and to an output of the third inverter.

11. The integrated circuit of claim 10, wherein the first AND gate is configured to output a first alignment signal when the feedback clock signal is earlier than the reference clock signal and the second AND gate is configured to output a second alignment signal when the feedback clock signal is later than the reference clock signal.

12. The integrated circuit of claim 11, comprising:
alignment circuitry for aligning the reference clock signal and the feedback clock signal utilizing one of the first alignment signal and the second alignment signal.

13. The integrated circuit of claim 11, comprising:
a third flip-flop responsive to an enable signal and an inverted reference clock signal,
wherein an output of the third flip-flop is configured to reset each of the first and second flip-flops.

14. The integrated circuit of claim 13, wherein the first, second and third flip-flops each comprise a D flip-flop.

15. The integrated circuit of claim 10, wherein the first and second flip-flops are each configured to receive an assert signal.

16. The integrated circuit of claim 10, wherein the feedback clock signal and the reference clock signal are each sampled on a negative edge of the reference clock signal.

17. A phase detector for aligning a reference clock signal and a feedback clock signal, wherein the phase detector is formed on a monolithic substrate, the phase detector comprising:
a first flip-flop responsive to the reference clock signal and an assert signal;
a first inverter responsive to an output of the first flip-flop;
a second flip-flop responsive to the feedback clock signal and the assert signal;
a second inverter responsive to an output of the second flip-flop;
a third inverter responsive to an output of the first inverter;
a fourth inverter responsive to an output of the second inverter;
a first AND gate responsive to the output of the first inverter and an output of the fourth inverter;
a second AND gate responsive to the output of the second inverter and an output of the third inverter;
a third flip-flop responsive to an enable signal for enabling the phase detector and to an inverted reference clock signal,
wherein an output of the third flip-flop is configured to reset each of the first and second flip-flops, and
wherein the first AND gate is configured to output a first alignment signal when the feedback clock signal is earlier than the reference clock signal and the second AND gate is configured to output a second alignment signal when the feedback clock signal is later than the reference clock signal.

18. The phase detector of claim 17, wherein the first, second and third flip-flops each comprise a D flip-flop.

19. The phase detector of claim 17, wherein the feedback clock signal and the reference clock signal are each sampled on a negative edge of the reference clock signal.

20. The phase detector of claim 17, comprising:
alignment circuitry for aligning the reference clock signal and the feedback clock signal utilizing one of the first alignment signal and the second alignment signal.

21. A phase detector, comprising:
a first bistable means for receiving a reference clock signal and for outputting a first logical signal to a first inverter means; and
a second bistable means for receiving a feedback clock signal and for outputting a second logical signal to a second inverter means,
wherein an output of the first inverter means is in communication with a first conjunction means and a third inverter means,
wherein an output of the second inverter means is in communication with a second conjunction means and a fourth inverter means,
wherein an output of the third inverter means is in communication with the second conjunction means,
wherein an output of the fourth inverter means is in communication with the first conjunction means, and
wherein the first conjunction means is configured to output a first alignment signal when the feedback clock signal is earlier than the reference clock signal and the second conjunction means is configured to output a second alignment signal when the feedback clock signal is later than the reference clock signal.

22. The phase detector of claim 21, comprising:
a third bistable means for receiving an enable signal for enabling the phase detector, for receiving an inverted reference clock signal, and for outputting a reset signal to each of the first and second bistable means.

23. The phase detector of claim 22, wherein the first, second and third bistable means each comprise a flip-flop means.

24. The phase detector of claim 22, wherein the first, second and third flip-flop means each comprise a D flip-flop means.

25. The phase detector of claim 21, wherein the first and second bistable means are each configured to receive an assert signal.

26. The phase detector of claim 21, wherein the first and second conjunction means each comprise an AND gate means.

27. The phase detector of claim 21, wherein the feedback clock signal and the reference clock signal are each sampled on a negative edge of the reference clock signal.

28. The phase detector of claim 21, wherein the phase detector is formed on a monolithic substrate.

29. The phase detector of claim 21, comprising:
means for aligning the reference clock signal and the feedback clock signal utilizing one of the first alignment signal and the second alignment signal,
wherein the aligning means is in communication with the phase detector.

30. An integrated circuit, comprising:
a first flip-flop means for receiving a reference clock signal;
a first inverter means for receiving an output of the first flip-flop means;
a second flip-flop means for receiving a feedback clock signal;
a second inverter means for receiving an output of the second flip-flop means;
a third inverter means for receiving an output of the first inverter means;
a fourth inverter means for receiving an output of the second inverter means;
a first AND gate means for conjunctively receiving the output of the first inverter means and an output of the fourth inverter means; and
a second AND gate means for conjunctively receiving the output of the second inverter means and an output of the third inverter means.

31. The integrated circuit of claim 30, wherein the first AND gate means is configured to output a first alignment signal when the feedback clock signal is earlier than the reference clock signal and the second AND gate means is configured to output a second alignment signal when the feedback clock signal is later than the reference clock signal.

32. The integrated circuit of claim 31, comprising:
means for aligning the reference clock signal and the feedback clock signal utilizing one of the first alignment signal and the second alignment signal.

33. The integrated circuit of claim 31, comprising:
a third flip-flop means for receiving an enable signal, for receiving an inverted reference clock signal, and for outputting a reset signal to each of the first and second flip-flop means.

34. The integrated circuit of claim 33, wherein the first, second and third flip-flop means each comprise a D flip-flop means.

35. The integrated circuit of claim 30, wherein the first and second flip-flop means are each configured to receive an assert signal.

36. The integrated circuit of claim 30, wherein the feedback clock signal and the reference clock signal are each sampled on a negative edge of the reference clock signal.

37. A phase detector for aligning a reference clock signal and a feedback clock signal, wherein the phase detector is formed on a monolithic substrate, the phase detector comprising:
a first flip-flop means for receiving the reference clock signal and an assert signal;
a first inverter means for receiving an output of the first flip-flop means;
a second flip-flop means for receiving the feedback clock signal and the assert signal;
a second inverter means for receiving an output of the second flip-flop means;
a third inverter means for receiving an output of the first inverter means;
a fourth inverter means for receiving an output of the second inverter means;
a first AND gate means for conjunctively receiving the output of the first inverter means and an output of the fourth inverter means;
a second AND gate means for conjunctively receiving the output of the second inverter means and an output of the third inverter means;
a third flip-flop means for receiving an enable signal for enabling the phase detector, for receiving an inverted reference clock signal, and for outputting a reset signal to each of the first and second flip-flop means,
wherein the first AND gate means is configured to output a first alignment signal when the feedback clock signal is earlier than the reference clock signal and the second AND gate is configured to output a second alignment signal when the feedback clock signal is later than the reference clock signal.

38. The phase detector of claim 37, wherein the first, second and third flip-flop means each comprise a D flip-flop means.

39. The phase detector of claim 37, wherein the feedback clock signal and the reference clock signal are each sampled on a negative edge of the reference clock signal.

40. The phase detector of claim 37, comprising:
means for aligning the reference clock signal and the feedback clock signal utilizing one of the first alignment signal and the second alignment signal.

41. A method of aligning a reference clock signal and a feedback clock signal, comprising the steps of:
a.) receiving the reference clock signal and the feedback clock signal;
b.) generating a first logical output signal utilizing the reference clock signal and an assert signal;
c.) generating a second logical output signal utilizing the feedback clock signal and the assert signal;
d.) inverting the first logical output signal to generate a first inverted logical signal;
e.) inverting the first inverted logical signal to generate a second inverted logical signal;
f.) inverting the second logical output signal to generate a third inverted logical signal;
g.) inverting the third inverted logical signal to generate a fourth inverted logical signal;
h.) conjunctively combining the first inverted logical signal and the fourth inverted logical signal to output a first alignment signal,
wherein the first alignment signal is output when the feedback clock signal is earlier than the reference clock signal; and
i.) conjunctively combining the second inverted logical signal and the third inverted logical signal to output a second alignment signal,
wherein the second alignment signal is output when the feedback clock signal is later than the reference clock signal.

42. The method of claim 41, comprising the steps of:
j.) receiving an enable signal and an inverted reference clock signal;
k.) generating a reset signal utilizing the enable signal and the inverted clock signal; and
l.) resetting steps (b) and (c) utilizing the reset signal.

43. The method of claim 42, wherein step (k) comprises the step of:
m.) sampling the feedback clock signal and the reference clock signal on a negative edge of the reference clock signal.

44. The method of claim 41, comprising the step of:
  j.) aligning the reference clock signal and the feedback clock signal utilizing one of the first alignment signal and the second alignment signal.

45. A method of aligning a reference clock signal and a feedback clock signal, comprising the steps of:
  a.) receiving an enable signal and an inverted reference clock signal;
  b.) generating a reset signal utilizing the enable signal and the inverted clock signal;
  c.) receiving the reference clock signal and the feedback clock signal;
  d.) sampling the feedback clock signal and the reference clock signal on a negative edge of the reference clock signal utilizing the reset signal;
  e.) generating a first logical output signal utilizing the reference clock signal and an assert signal;
  f.) generating a second logical output signal utilizing the feedback clock signal and the assert signal;
  g.) inverting the first logical output signal to generate a first inverted logical signal;
  h.) inverting the first inverted logical signal to generate a second inverted logical signal;
  i.) inverting the second logical output signal to generate a third inverted logical signal;
  j.) inverting the third inverted logical signal to generate a fourth inverted logical signal;
  k.) conjunctively combining the first inverted logical signal and the fourth inverted logical signal to output a first alignment signal,
    wherein the first alignment signal is output when the feedback clock signal is earlier than the reference clock signal;
  l.) conjunctively combining the second inverted logical signal and the third inverted logical signal to output a second alignment signal,
    wherein the second alignment signal is output when the feedback clock signal is later than the reference clock signal; and
  m.) aligning the reference clock signal and the feedback clock signal utilizing one of the first alignment signal and the second alignment signal.

* * * * *